(12) United States Patent
Berg et al.

(10) Patent No.: US 7,183,120 B2
(45) Date of Patent: Feb. 27, 2007

(54) ETCH-STOP MATERIAL FOR IMPROVED MANUFACTURE OF MAGNETIC DEVICES

(75) Inventors: Lonny Berg, Elk River, MN (US); Daniel Baseman, Minneapolis, MN (US); Wei (David) DZ Zou, Minnetonka, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/284,922

(22) Filed: Oct. 31, 2002

(65) Prior Publication Data

US 2004/0087037 A1    May 6, 2004

(51) Int. Cl.
*H01L 21/00* (2006.01)
(52) U.S. Cl. .................................. 438/3; 257/E21.208
(58) Field of Classification Search .................... 438/3, 438/171, 210, 381; 257/295; 365/171, 173, 365/158
See application file for complete search history.

(56) References Cited

U.S. PATENT DOCUMENTS

| | | | |
|---|---|---|---|
| 5,525,542 A * | 6/1996 | Maniar et al. ............... | 438/669 |
| 5,861,328 A * | 1/1999 | Tehrani et al. ............... | 438/210 |
| 5,915,167 A | 6/1999 | Leedy | |
| 5,940,319 A * | 8/1999 | Durlam et al. ............... | 365/171 |
| 5,968,594 A * | 10/1999 | Hu et al. ................... | 427/248.1 |
| 5,989,690 A | 11/1999 | Fujikata et al. | |
| 5,996,213 A | 12/1999 | Shen et al. | |
| 6,048,739 A | 4/2000 | Hurst et al. | |
| 6,133,640 A | 10/2000 | Leedy | |
| 6,156,487 A | 12/2000 | Jennison et al. | |
| 6,174,737 B1 * | 1/2001 | Durlam et al. ................. | 438/3 |
| 6,195,229 B1 | 2/2001 | Shen et al. | |
| 6,198,607 B1 | 3/2001 | Cain et al. | |
| 6,208,545 B1 | 3/2001 | Leedy | |
| 6,211,035 B1 * | 4/2001 | Moise et al. ................. | 438/396 |
| 6,211,090 B1 | 4/2001 | Durlam et al. | |
| 6,261,967 B1 * | 7/2001 | Athavale et al. ............ | 438/717 |
| 6,274,496 B1 * | 8/2001 | Leusink et al. ............. | 438/685 |

(Continued)

FOREIGN PATENT DOCUMENTS

WO    WO 02/059976 A1    8/2002

(Continued)

OTHER PUBLICATIONS

Wolf et al. Silicon Processing for the VLSI Era, vol. 1—Process Technology, pp. 171-173, Lattice Press, 1986.*

(Continued)

*Primary Examiner*—Scott B. Geyer
(74) *Attorney, Agent, or Firm*—McDonnell Boehnen Hulbert & Berghoff LLP (57) ABSTRACT

A method for fabricating a magnetoresistive device having at least one active region, which may be formed into a magnetic memory bit, sensor element and/or other device, is provided. In forming the magnetoresistive device, a magnetoresistive stack, such as a giant magnetoresistive stack, is formed over a substrate. In addition, a substantially antireflective cap layer formed from titanium nitride, aluminum nitride, and/or other substantially antireflective material, as opposed to the materials commonly used to form a cap layer, is formed over the magnetoresistive stack. The substantially antireflective cap layer is usable as an etch stop for later processing in forming the magnetic memory bit, sensor element and/or other device.

8 Claims, 5 Drawing Sheets

U.S. PATENT DOCUMENTS

| | | | |
|---|---|---|---|
| 6,306,771 | B1 | 10/2001 | Syau et al. |
| 6,344,952 | B1 | 2/2002 | Biskeborn et al. |
| 6,353,318 | B1 * | 3/2002 | Sin et al. ............... 324/252 |
| 6,391,430 | B1 | 5/2002 | Fullerton et al. |
| 6,392,922 | B1 | 5/2002 | Liu et al. |
| 6,416,936 | B1 | 7/2002 | Jennison et al. |
| 6,433,965 | B1 | 8/2002 | Gopinathan et al. |
| 6,445,536 | B1 | 9/2002 | Rudy et al. |
| 6,462,541 | B1 | 10/2002 | Wang et al. |
| 6,466,402 | B1 | 10/2002 | Crue, Jr. et al. |
| 6,468,809 | B1 * | 10/2002 | Prinz et al. ............. 436/526 |
| 6,480,411 | B1 * | 11/2002 | Koganei .................. 365/158 |
| 6,500,676 | B1 | 12/2002 | Ramberg |
| 6,555,858 | B1 * | 4/2003 | Jones et al. ............. 257/295 |
| 6,611,453 | B2 * | 8/2003 | Ning ....................... 365/171 |
| 6,680,831 | B2 * | 1/2004 | Hiramoto et al. ...... 360/324.11 |
| 6,821,907 | B2 * | 11/2004 | Hwang et al. ............ 438/709 |
| 6,893,893 | B2 * | 5/2005 | Nallan et al. ............. 438/61 |
| 2002/0098281 | A1 * | 7/2002 | Ning ....................... 427/129 |
| 2002/0135956 | A1 * | 9/2002 | Hasegawa et al. ...... 360/324.12 |
| 2002/0154456 | A1 * | 10/2002 | Carey et al. ............ 360/324.11 |
| 2003/0099069 | A1 * | 5/2003 | Kagami et al. .......... 360/313 |
| 2003/0199104 | A1 * | 10/2003 | Leuschner et al. ........... 438/3 |
| 2004/0026369 | A1 * | 2/2004 | Ying et al. ............... 216/63 |
| 2004/0043620 | A1 * | 3/2004 | Ying et al. ............... 438/710 |

FOREIGN PATENT DOCUMENTS

| WO | WO 03/067600 A2 | 8/2003 |
|---|---|---|
| WO | WO 03/094170 A2 | 11/2003 |

OTHER PUBLICATIONS

Grochowski, Edward, *Emerging Trends in Data Storage on Magnetic Hard Disk Drives*, datatech, pp. 11-16.

Peterson, Bill, Taira, Kazuo, Koshiba, Nobu, Somerville, Linda, Holscher, Richard, *Approaches to Reducing Edge Roughness and Substrate Poisoning of ESCAP Photoresists*, Semiconductor Fabtech-8th Edition, pp. 183-188.

K.B. Jung, J. Marburger, F. Sharifi, Y.D. Park, S.J. Pearton, *Long Term Stability Of Dry Etched Magnetoresistive Random Access Memory Elements*, Journal of Vacuum Science & Technology A: Vacuum, Surfaces, and Films, Jan. 2000, vol. 18, Issue 1, pp. 268-272.

Kamata et al., *Preparation of TiN Films*, Faculty of Engineering, The Technological University of Nagaoka, Nagaokashi, Niigataken, Mar. 10, 1988, pp. 841-844.

Goldberg et al., *Low Temperature In-Situ Sequential Chemical Vapor Deposition of Ti/TiN Ultrathin Bilayers for ULSI Barrier Applications*, Conference Proceedings ULSI-X, Materials Research Society, 1995, pp. 247-257.

Blumenthal et al., *Advanced Metallization for ULSI Applications in 1994*, Material Research Society, 1995, pp. 209-337.

\* cited by examiner

ETCH-STOP MATERIAL FOR IMPROVED MANUFACTURE OF MAGNETIC DEVICES

GOVERNMENT RIGHTS

The United States Government has acquired certain rights in this invention pursuant to Contract No. DTRA01-00-C-0002 awarded by DTRA.

BACKGROUND

1. Field

The present invention relates generally to magnetic devices, and more particularly, relates to high-density magnetic devices, such as magnetic memory and/or sensors, and methods of manufacturing such devices.

2. Related Art

For over 2000 years, magnetic devices have been beneficially deployed in navigation equipment for sensing the Earth's magnetic poles. Current magnetoelectronic devices may be used in medical applications for magnetic resonance imaging; in military surveillance for detecting submarines and buried landmines; in highway toll systems for traffic detection of vehicles for automated-toll-pay systems; in disk drives as magnetic pickup heads; in magnetoelectronics memories for Magnetic Random Access Memories (MRAM); and in automated industrial equipment for proximity sensors.

Magnetoelectronic devices may be used to measure the presence, magnitude, and/or direction of a magnetic field, changes in a magnetic field due to a presence of a ferromagnetic object, characteristics of the Earth's field, and electrical current flow. Many different types and constructions of magnetoelectronic devices exist.

The types and constructions are generally dictated by the sensing technology, and the detectable magnetic field. Accurately and reliably measuring magnetic fields smaller than the Earth's field may present an obstacle for many magnetoelectronic devices, and thus, may limit the type and construction of the magnetoelectronic devices. One such device that appears to overcome these obstacles is a magnetoelectronic device that employs the giant magnetoresistive (GMR) effect. Magnetoelectronic devices that employ the GMR effect may be capable of measuring small fields from magnetized objects, electrical currents, deviations in the Earth's magnetic field, and non-magnetized objects.

A. Giant Magnetoresitive Effect

Reportedly, as a result of recent advances in the art of thin-film material processing, the giant magnetoresistive (GMR) effect was discovered in 1988 by Baibich et al. The GMR effect describes the phenomenon of dramatic resistance drop in certain materials in the presence of magnetic fields. This change in resistance divided by the total resistance of the GMR device may be defined as the magnetoresistive (MR) resistivity sensitivity of the GMR device.

At the core of many GMR magnetoelectronic devices is a GMR sensor element. The GMR sensor element may be used as the foundation for GMR magnetoelectronic devices, including unpinned sandwiches, antiferromagnetic multilayers, and antiferromagnetic pinned spin valves. Generally, this GMR sensor element is constructed in a stack configuration in which the stack contains a number of deposited layers of thin-film materials. Common to most GMR sensor elements, the minimum number of layers in the stack usually includes three layers—two magnetic layers separated by at least one conductive nonmagnetic spacer layer. It is believed that the MR resistivity sensitivity of the tri-layer and other multilayer stacks is a function of the thickness of the stack's spacer layers and the phenomenon of spin-dependent scattering of conduction electrons at the boundaries between the spacer layers and the magnetic layers.

In the absence of an external magnetic field and with a given thickness of a spacer layer, the magnetic layers in a tri-layer stack configuration may exchange magnetic coupling. This coupling may oscillate between ferromagnetically coupling and antiferromagnetically coupling depending on the thickness of the spacer layer.

The antiferromagnetic coupling is believed to cause the magnetic moments of the two magnetic layers to become antiparallel. In this antiparallel state, the stack of materials comprising the GMR sensor element is believed to exhibit maximum spin-dependent scattering of conduction electrons. The maximum spin-dependent scattering of conduction electrons in turn is believed to place the GMR sensor element in a maximum resistance state.

By applying an adequate magnetic field to overcome the antiferromagnetic coupling, the antiparallel magnetic moments of the magnetic layers become parallel, thereby decreasing the spin-dependent electrons of the conduction electrons, and likewise, decreasing the resistance in the GMR magnetoelectronic devices. On the other hand, the ferromagnetic coupling is believed to cause the magnetic moments of the two magnetic layers to become parallel, which in turn is believed to exhibit something less than maximum spin-dependent scattering of conduction electrons or a lower resistance state.

B. Magnetoresistive Random Access Memory

As with other magnetoelectronic devices, the GMR structure of an MRAM consists of a GMR stack having a spacer layer "sandwiched" between two magnetic layers. This structure is normally manufactured using integrated circuit processing techniques by forming the GMR stack one sheet or layer of material over another and then subdividing the stack of layers into individual GMR stacks commonly referred to as "bits." Each of the bits are binary. That is, they "store" or take on two discrete states, commonly denoted as a "0" or a "1."

Given that the magnetic moment (or moments) of each of the magnetic layers may be selectively aligned along any axis, setting the "0" or "1" state may vary. In one option, the "0" state occurs by setting a magnetization vector (i.e., aligning the magnetic moment or moments) of the bottom magnetic layer or the "storage layer" of the MRAM bit in a horizontal plane with its direction pointing to the left. To sense or "read" that the MRAM bit is set to the "0" state, the change in resistance of the stack is measured as the magnetization vector of the top magnetic layer or the "sense layer" is flipped. For instance, by changing the magnetization vector of the sense layer from its default position, i.e. changing it to the parallel storage layer position, to a position antiparallel to the storage layer, the MRAM bit changes from low resistance to high resistance and indicates the MRAM bit is set to the "0" state.

On the other hand, the "1" state occurs when the alignment of the magnetization vector (i.e., the alignment of the magnetic moment or moments) of the storage layer of the MRAM bit is set in a horizontal plane with its direction pointing to the right. By flipping the magnetization vector top magnetic layer or the "sense layer" from its default position, which is now antiparallel (due to the change in direction of the storage layer), to parallel causes the resistance of the MRAM bit to switch from high resistance to low resistance, thus indicating the MRAM bit is in the "1" state.

For the MRAM bit to function, there must be a way to "write" the bit, i.e., change the bit from one state to another, and to "read" the bit, i.e., sense the bit's state. This may be done by using the same material for both the magnetic layers, but having different thicknesses. This causes the thicker layer to be more resistant to change in the presence of an externally applied magnetic field than the thinner layer. The magnetization vector of the thinner layer will change or "flip" at a lower field strength than the thicker layer. Accordingly, the storage layer of the GMR stack will be thicker than the sense layer.

Therefore, a small magnetic field (e.g., a current) may change only the sense-layer-magnetization direction, while a large magnetic field may change both the sense and storage layer magnetization-vector directions. Details describing the principals of operation of MRAM may be found in Tumanski. S., *Thin Film Magnetoresistive Sensors*, U.K., Institute of Physics, 2001, p. 353–357. These details are fully incorporated herein by reference.

C. Magnetoresistive Sensors

Like the magnetic memories, magnetoelectronic sensors function by sensing the change in resistance in the GMR stack. For example, a GMR stack deployed in a disk drive's read/write head reacts similarly to a magnetic memory. The GMR sensor stack in the disk drive heads, however, are typically comprised of four layers of thin material sandwiched together into a single structure. Generally, this structure includes the tri-layer GMR stack and an additional layer formed adjacent to one of the magnetic layers. The additional layer is known as the exchange or "pinning" layer. The exchange layer fixes or "pins" the magnetization of one of the magnetic layers, usually the adjacent magnetic layer, in the same direction as the magnetization of the pinning layer, thus causing the adjacent magnetic layer to become a "pinned" layer. The other magnetic layer or "free layer," however, is free to change magnetization direction in the presence of a magnetic field.

In operation, when the disk drive head passes over a magnetic field of one polarity on a disk, which corresponds to a "0" state, the free layer changes from its default magnetization direction, i.e., antiparallel, to parallel. That is, the "0" state indicates that the GMR stack changes from a high resistance state to a low resistance state. When the head passes over a magnetic field of the opposite polarity or direction, i.e., a "1" state, the free layer magnetism rotates so that they antiparallel with the pinned layer.

Widespread application for these devices may reside in replacing existing non-magnetic circuitry performing similar functions. Given the non-volatility, and fast read/write performance of the GMR stack, these devices may become the product of choice. To do this, however, the magnetoelectronic devices should meet the size and performance of current devices. In manufacturing these magnetoelectronic devices, problems occur as the circuit density of GMR integrated circuits ("chips") increases. Problems in processing high-density GMR chips may cause the manufacturing yield to fall to about zero, making the GMR chips technologically or monetarily impracticable. These processing problems may occur at various stages in manufacturing GMR chips. For instance, current manufactures and/or manufacturers of MRAM bits (and other GMR devices) use chromium-silicon (CrSi) films to act as an etch stop layer during bit formation. During the formation of the etch stop layer, the CrSi target manufacturing processes produce defects in deposited layers. When attempting to manufacture a megabyte GMR memory integrated circuit, calculations indicate that the defects occurring during the formation of the CrSi layer alone would reduce the yield to approximately 12%. When combined with all process steps, the ability to yield a functional GMR integrated circuit is near zero.

Therefore, it would be desirable to reduce defects so as to increase yield and to lower cost of manufacture in order to manufacture and provide high-density magnetoelectronic devices. Further, it would be desirable to improve the manufacturing of magnetoelectronic devices by simplifying processing steps, and increasing the repeatability of the processing steps.

SUMMARY

A method for fabricating a magnetoresistive device having at least one active region, which may be formed into a magnetic memory bit, sensor element and/or other device, is provided. In forming the magnetoresistive device, a magnetoresistive stack, such as a giant magnetoresistive stack, is formed over a substrate. In addition, a substantially antireflective cap layer, which may be formed from titanium nitride and/or aluminum nitride as opposed to non-antireflective materials commonly used to form a cap layer, is formed over the magnetoresistive stack. This substantially antireflective cap layer is usable as an etch stop for later processing in forming the magnetic memory bit, sensor element and/or other device.

The cap layer formed from titanium nitride (TiN), aluminum nitride (AlN) and/or other substantially antireflective material replaces the common used cap materials, such as Chromium Silicon, Tantalum, and Tantalum Nitride. The benefits of using a properly developed, low temperature TiN, AlN and/or other substantially antireflective material deposition process, include (i) very low defect levels, i.e., low levels of pinholes, electrical shorts, undesirable particulates and other defects; (ii) improved switching thresholds of the magnetoresistive device; and (iii) high selectivity of etch rate to an overlying mask layer.

Due to the inherent antireflective characteristics of the substantially antireflective cap layer, some typical processing steps for fabricating the magnetoresistive device may be eliminated and/or simplified. In addition, because of the antireflective characteristics of the substantially antireflective cap layer, repeatability and accuracy of photolithography processing of overlying layers may increase. This properly developed substantially antireflective cap layer is believed to provide increased manufacturability and yield of producing GMR devices.

BRIEF DESCRIPTION OF THE DRAWINGS

Presently preferred embodiments are described below in conjunction with the appended drawing figures. In these drawings, like reference numerals refer to like elements.

DETAILED DESCRIPTION OF PRESENTLY PREFERRED EMBODIMENTS

1. Overview

In one exemplary embodiment, substantially antireflective layer formed from a TiN, AlN, and other substantially antireflective material is formed over a magnetoresistive stack of a magnetoresistive device. This substantially antireflective layer, which is useable as an etch stop, provides an improvement over the present state of the art. A properly developed, low temperature deposition process can provide such a TiN, AlN and/or other substantially antireflective material layer, which in turn provides improvements that include very low defect levels and high selectivity of etch rate for patterning and etching overlying layers.

It is believed that due to the antireflective characteristics of the TiN, AlN, and other substantially antireflective material that a, properly developed, low-temperature deposition process will also provide other improvements in subsequent processing, such as simplifying and increasing the repeatability of a later occurring photolithography process. These improvements are believed to provide increased manufacturability and yield of magnetoresistive devices, which, for example, may include magnetoresistive sensors, magnetoresistive memory, and others.

In addition, the sensing technology, while similar, may vary from one magnetoresistive device to another, and thus, the construction of the magnetoresistive device may vary as well. For instance, the sensing technology may vary from anisotropic magnetoresistive sensing, to giant-magnetoresistive sensing, to colossal magnetoresistive sensing and/or other magnetoresistive sensing. Further, for each of these sensing technologies, the construction of the magnetoresistive stack may vary (e.g., a GMR stack may have 3 layers, whereas an anisotropic stack may only have two layers).

Moreover, during manufacturing, the magnetoresistive stack can be subdivided into a plurality of active regions or remain as a single active region. These active regions may compose the sensing portion of the magnetoresistive sensors and other devices, and/or one or more bits of the magnetoresistive memory.

For purposes of illustration and for the sake of simplicity, the sensing technology referenced hereinafter is based on exemplary giant magnetoresistive sensing technology, and the material for the substantially antireflective cap layer referenced hereinafter will be TiN and AlN. It is to be understood, however, that other sensing technologies could also be used, and other substantially antireflective materials for the cap layer could also be used.

Accordingly, a giant magnetoresistive (GMR) device and method for manufacturing the same employing a giant magnetoresistive stack is provided with an integral TiN and/or AlN cap layer that provides advantages over the present state of the art. Generally, the composition and construction of the exemplary GMR stack includes (i) a first-ferromagnetic layer over which is formed, (ii) a spacer layer, and (iii) a second-ferromagnetic layer formed over the spacer layer.

The GMR stack may include other layers as well. For instance, by employing a buffer-oxide layer in its composition, an exemplary GMR device and stack may achieve enhanced magnetoresistive (MR) resistivity sensitivity as compared to stacks without such a buffer oxide layer. Details of such an exemplary magnetoresistive device can be found in co-pending U.S. patent application Ser. No. 10/199,198, assigned to the assignees of this application, filed on Jul. 19, 2002, and entitled "Enhanced Giant Magnetoresistive Device and Method," which is herein incorporated by reference.

2. Exemplary Unpinned GMR Device Architecture

Figure 1:
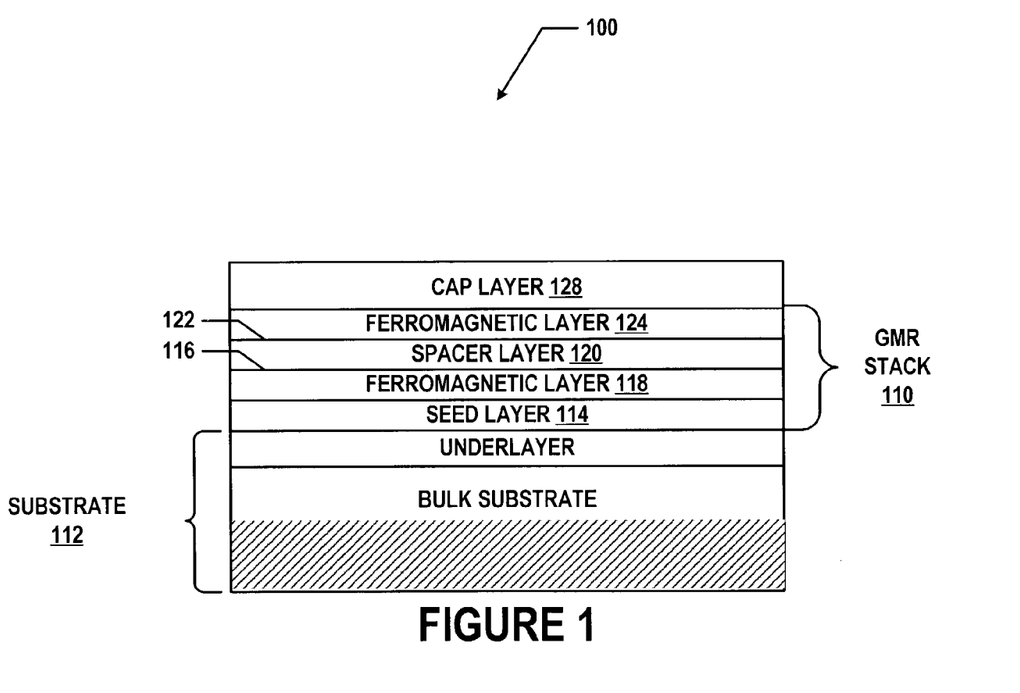
FIG. 1 is a first cross-sectional view of a GMR device for carrying out an exemplary embodiment.

Referring to the drawings, FIG. 1 generally depicts a GMR device 100 for carrying out an exemplary embodiment. As shown in FIG. 1, the GMR device 100 illustrates a substrate 112, a seed layer 114, and an unpinned sandwich type GMR stack 110. The unpinned sandwich type GMR stack 110 includes a first-ferromagnetic layer 118, a spacer layer 120, a second-ferromagnetic layer 124, a cap layer 128 and other sacrificial and/or beneficial layers. These other sacrificial (i.e., material used during processing to construct the final product, but not present in the final product) and/or beneficial (i.e., material used during processing to construct the final product, and present in the final product) facilitate construction of the GMR device 100, thus, hereinafter, these layers shall be collectively referred to as facilitative layers, unless otherwise indicated.

As illustrated in FIG. 1 in the GMR stack 110, the second ferromagnetic layer 124 is formed over the spacer layer 120. The spacer layer 120 in turn is formed over the first-ferromagnetic layer 118. The first-ferromagnetic layer 118 is formed over the seed layer 112 and in turn over the substrate 112. Other arrangements are possible as well and FIG. 1 is not necessarily to scale.

The substrate 112 may be fabricated from non-magnetic ceramic materials including oxides, nitrides, borides, and carbides. The substrate 112 may also be fabricated from heterogeneous combinations and laminates of such non-magnetic ceramic materials. Additionally, homogenous combinations and laminates of the non-magnetic ceramic materials may be included in the substrate 112. Alternatively, the substrate 112 may comprise non-magnetic ceramic materials with an accompanying dielectric fabricated from metal or metallic oxides. Beyond ceramics, the substrate 112 may be fabricated from metals, such as an Aluminum Titanium alloy (Master AlTiC), polymers, and glass.

In yet another alternative, the composition of the substrate 112 may contain non-magnetic silicon material. In such a case, the silicon material may be processed to form a dielectric. Consequently, the substrate 112 may include an insulating oxide layer such as silicon dioxide ($SiO_2$), Hafnium oxide (HfO), Tantalum oxide ($Ta_2O_5$), Titanium oxide ($TiO_2$) or other insulating oxide. In addition to the insulating oxide, the substrate may include an insulating or highly resistive nitride layer constructed of such materials as silicon nitride ($Si_3N_4$), aluminum nitride (AlN), or Tantalum nitride (TaN). An exemplary substrate may be fabricated from a <100> orientation-P-type (e.g., Boron) bulk-silicon wafer over which is grown a layer of thermal oxide ($SiO_2$) at a thickness of not less than about 500 angstroms. Deposited over the thermal oxide is a layer of $Si_3N_4$ of a thickness of not less than about 500 angstroms. The thickness of the bulk silicon wafer, the thermal oxide layer, and $Si_3N_4$ layer, however, may vary.

Formed atop the substrate 112 is the seed layer 114, which may be fabricated from, but need not be limited to, one or more metals or metallic materials, one or more laminates of metal or metallic materials, one or more metal or metallic alloys, and/or one or more laminates of metal or metallic alloys. For example, the seed layer 114 may be fabricated from Tantalum (Ta), Tantalum Nitride (TaN), Hafnium (Ha), Zirconium (Zr), Rubidium (Ru) and/or any other metallic material or metal selected from Groups IVB-VIB of the Periodic Table of Elements. Depending on its makeup and other parameters, the thickness of the seed layer 114 may be varied. Preferably, however, the thickness of the seed layer 114 may range from about 10 angstroms to about 100 angstroms. The seed layer 114 provides a base upon which the GMR stack 110 and other facilitative layers may be fabricated.

A first interface 116 may be formed at the junction of first-ferromagnetic layer 118 and the seed layer 112, when first-ferromagnetic layer 118 is formed directly over the seed layer 112. Other facilitative layers, however, may separate the seed layer 112 and the first-ferromagnetic layer 118. As noted above, a buffer-oxide layer may be placed between the seed layer 112 and the first-ferromagnetic layer 118.

Like other layers in the GMR sensor element, the composition of the first-ferromagnetic layer 118 may be varied. Generally, the composition of the first-ferromagnetic layer 118 includes ferromagnetic materials such as cobalt ferromagnetic materials, nickel ferromagnetic materials, and/or other ferromagnetic materials. Heterogeneous and homogenous amalgamations of such ferromagnetic materials may be included in the mix of first-ferromagnetic layer 118 materials as well. These amalgamations may take the form of laminates, alloys, and laminates of alloys including nickel-iron alloy (NiFe) and laminates thereof, and cobalt-iron alloy (CoFe) and laminates thereof, nickel-iron-cobalt alloy (NiFeCo) and laminates thereof, and cobalt-iron-boron alloy (CoFeB) and laminates thereof. An exemplary first-ferromagnetic layer 118 may be fabricated from a NiFe alloy (Permalloy) having a nickel:iron weight ratio from about 40:60 to about 90:10.

Again, paralleling the seed layer 114, the thickness of the first-ferromagnetic layer 118 may vary. This variation may depend on a multitude of factors. For instance, the thickness may depend on the desired amount of ferromagnetic coupling or antiferromagnetic coupling between the first-ferromagnetic layer 118 and the second-ferromagnetic layer 124, and/or the mechanical, chemical, and magnetic smoothness of the first interface 116 between first-ferromagnetic layer 118 and the spacer layer 120. Undertaking these considerations, in one exemplary embodiment the thickness of the first-ferromagnetic layer 118 comprised of Permalloy may range from about 2 angstroms to about 100 angstroms.

The spacer layer 120 may be formed directly over the first ferromagnetic layer 118. A fabrication or diffusion barrier layer, as well as other facilitative layers, may be formed over the first-ferromagnetic layer 118, thereby separating the spacer layer 120 from the first-ferromagnetic layer 118. The composition of the spacer layer 120 may include conductive non-magnetic materials, conductive paramagnetic materials, conductive diamagnetic materials, and/or other materials conventionally used in the fabrication of the spacer layer 120 in GMR devices. Exemplary materials may include copper, gold, aluminum, rubidium, and/or silver.

In the composition of the spacer layer 120, these materials may be essentially pure (e.g., more than 98% pure) or take the form of amalgamations, alloys, laminates, and/or laminates of alloys. Preferably, the spacer layer 120 is fabricated from essentially pure copper. In an exemplary construction, the thickness of the spacer layer 120 fabricated from copper may range from about 16 angstroms to about 60 angstroms, when formed over the first-ferromagnetic layer 118 comprising Permalloy and having a thickness of about 2 angstroms to about 100 angstroms. In other compositions, the thickness of the spacer layer 120 may vary.

Formed over the spacer layer 120 is second-ferromagnetic layer 124. This second-ferromagnetic layer 124 is preferably formed directly over the spacer layer 120, thereby forming a second interface 122. Other facilitative layers, such as a fabrication-barrier layer, however, may be formed over the spacer layer 120, thereby separating the second-ferromagnetic layer 124 from the spacer layer 120. In such a case, the second interface 122 is formed between the facilitative layer adjacent to the second-ferromagnetic layer 124 and the second-ferromagnetic layer 124.

The composition of the second-ferromagnetic layer 124 generally includes materials known in the art of GMR devices. These materials may be ferromagnetic materials analogous and/or equivalent to the materials used to fabricate the first-ferromagnetic layer 118 including nickel, cobalt, and/or iron ferromagnetic materials. In addition to the substantially pure versions of such ferromagnetic materials, the second-ferromagnetic layer 124 may be fabricated from amalgamations, laminates, alloys, and/or laminates of alloys of ferromagnetic materials. As with the first-ferromagnetic layer 118, an exemplary second-ferromagnetic layer 124 may be fabricated from a NiFe alloy (Permalloy) having a nickel:iron weight ratio from about 40:60 to about 90:10.

Like the first-ferromagnetic layer 118, the thickness of the second-ferromagnetic layer 124 may range from about 2 angstroms to about 100 angstroms. In an exemplary configuration, the thickness of the second-ferromagnetic layer 124 fabricated from Permalloy, which may be formed directly over spacer layer 118 comprised of Cu, may range from about 2 angstroms to about 100 angstroms. The thickness of the second-ferromagnetic layer 124 may vary in cross-section for Cu as well as for other fabrication-material types.

While FIG. 1 only illustrates one GMR stack 100 (i.e., the layers above the seed layer 112 and up to and including the second-ferromagnetic layer 124), one or more GMR stacks may be "stacked" atop another GMR stack to increase the MR resistivity sensitivity of the GMR device 100 as a whole. As known in the art, these devices are generally referred to as "multilayers," which generally include additional barrier layers and other facilitative layers inserted in between each stack to separate each of the stacks. The thickness of the additional barrier layers, which may vary, control the ferromagnetic and antiferromagnetic coupling between the adjacent layers of the concatenated GMR stacks.

Formed atop the upper-most layer or, as shown in FIG. 1, the second-ferromagnetic layer 124 is the substantially anti-reflective cap layer 128 (i.e., a layer capable of suppressing reflective notching, standing wave effects, and/or swing ration caused by thin-film interference), which as opposed to materials conventionally used in the fabrication of the cap layer in GMR devices, is made from one or more compositions of TiN and/or AlN. As such, the TiN and/or AlN provide high resistivity to limit current shunting through cap layer 128 without affecting the performance of the GMR stack 100. This cap layer 128, due to its inherent antireflective characteristics, provides an exemplary etch stop that may be used during the processing of the GMR stack.

As a partial sacrificial and beneficial layer, the TiN and/or AlN cap layer 128 eliminates steps normally required during the processing. For instance, the processing steps necessary for a bottom antireflective coating (BARC) process, which are normally used to form the GMR stack 110 into different configurations, may be eliminated. This not only simplifies processing, but also reduces cost of manufacture and is believed not to affect yield, as other materials used for the cap layer are believed to do. Further, when etching and/or other processing the TiN and/or AlN cap layer to form an active region of the GMR stack 110, the TiN and/or AlN material leaves less particulate than conventional cap layer materials.

An exemplary cap layer 128 may be fabricated from TiN and/or AlN having a thickness not less than 10 angstroms. The thickness of the cap layer 128, however, may be deposited to a thickness wherein the resistance of the TiN and/or AlN is sufficiently high to prevent current shunting from the GMR stack 110, and thus, without reducing the signal ratio of the GMR stack 110.

3. Exemplary Pinned GMR Device Architecture

In an alternative configuration, the GMR stack 110 may be an exchange biased or "pinned" sandwich type GMR element or GMR spin valve. In this alternative arrangement, an additional layer or antiferromagnetic layer is included in the GMR stack 110. The antiferromagnetic layer is formed over the second-ferromagnetic layer 124, and exchange biases or "pins" the magnetic moments of the second-ferromagnetic layer 124, thereby aligning the magnetic moments to that of the antiferromagnetic layer's moments. Generally, the magnetic moments of the second-ferromagnetic layer 124 are pinned antiparallel to the magnetic moments of the first-ferromagnetic layer 118. The magnetic moments of the second-ferromagnetic layer 124 and the first-ferromagnetic layer 118, however, may be aligned in parallel.

The composition of the antiferromagnetic layer may include exchange-biasing or pinning-material layers conventionally used in the art of GMR devices. Representative of these materials are antiferromagnetic-hard-magnetic-pinning versions of (i) FeMn alloys, (ii) NiO alloys, (iii) PtMn alloys, (iv) IrMn alloys, and (v) other higher-order alloys that incorporate alloys (i)–(iv). Other pinning materials may include a permanent-magnet-hard-magnetic-pinning version of a cobalt-platinum alloy, and/or other higher-order cobalt-platinum alloys. The antiferromagnetic layer may also take the form of laminates, and laminates of alloys that amalgamate one or more of the group that includes a FeMn alloy, NiMn alloy, PtMn alloy, IrMn alloy, CoPt alloy, and/or other higher-order version of such alloys. An exemplary antiferromagnetic layer may be fabricated from a FeMn alloy having a Fe:Mn weight ratio from about 40:60 to about 60:40.

As with the rest of the layers, the thickness of the antiferromagnetic layer may vary not only in layer cross-section for FeMn, but also for other antiferromagnetic layer composition materials. Exemplary thicknesses of the antiferromagnetic layer may range from about 70 angstroms to about 150 angstroms for a composition from about 40:60 to about 60:40 of FeMn by weight. Alternatively, the thickness of the antiferromagnetic layer may range from about 70 angstroms to about 200 angstroms for a composition from about 17:83 to about 22:78 of IrMn by weight, and may range from about 100 angstroms to about 250 angstroms for a composition from about 30:70 to about 40:60 of PtMn by weight.

4. GMR Device Manufacturing Process

Figure 2:
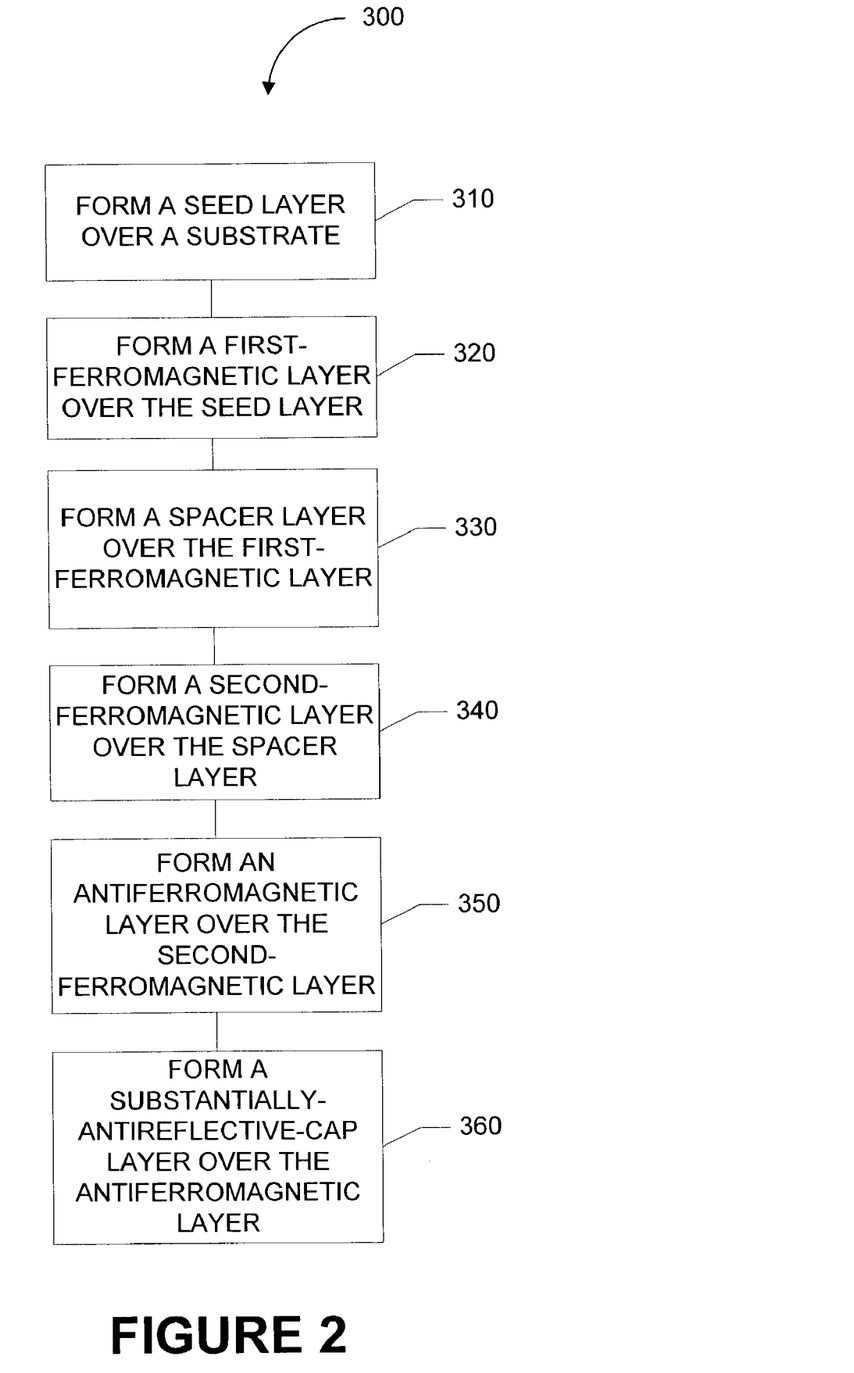
FIG. 2 is a simplified flow chart depicting an exemplary process for manufacturing a GMR sensor element in accordance with an exemplary embodiment.

Referring now to FIG. 2, a simplified flow chart 300 is provided depicting an exemplary process for manufacturing a GMR sensor element. FIG. 2 is described in reference to the exemplary GMR device 100 shown in FIG. 1 with an additional antiferromagnetic layer. The exemplary process includes (i) forming a seed layer 114 over a substrate 112 as shown in block 310, (ii) forming a first-ferromagnetic layer 118 over seed layer 114 as shown in block 320, (iii) forming a spacer layer 120 over the first-ferromagnetic layer 118 as shown in block 330, (iv) forming a second-ferromagnetic layer 124 over the spacer layer 114 as shown in block 340, (v) forming an antiferromagnetic layer (not shown in FIG. 1) over the second-ferromagnetic layer 124 as shown in block 350, and (vi) forming a substantially antireflective cap layer 128 over the antiferromagnetic layer as shown in block 360.

Block 310 shows the function of forming a seed layer 114 over a substrate 112. This function may be carried out by forming or depositing a layer of Ta, Ha, Zr, TaN, Ru and/or any other metallic material or metal selected from Groups IVB–VIB of the Periodic Table of Elements over a substrate. In an exemplary configuration, the substrate 112 is formed from <100> orientation P-type (e.g., Boron) doped silicon wafer having a thermally grown $SiO_2$ layer, and sputtered $Si_3N_4$ layer formed over the thermal oxide layer.

Depositing the layer of metallic material or metal may be carried out using one or more of known vapor deposition techniques. These vapor deposition techniques may include chemical vapor deposition (CVD), such as low-pressure CVD (LPCVD); and physical vapor deposition (PVD), such as molecular beam epitaxy (MBE), RF-Diode sputtering, Magnetron sputtering, and/or Ion Beam Assisted Deposition or Ion Beam Deposition (IBD).

In forming the seed layer 114 over the substrate 112, the seed layer 114 may be fabricated from a Ta target using the IBD process to form a layer of Ta having a thickness from about 10 angstroms to about 100 angstroms. As known in the art of IBD processing, a number of IBD process parameters are used to control or facilitate the deposition of metals and other materials. The IBD process parameters for producing a seed layer 114 of Ta may include (i) a seed-layer-deposition pressure parameter, (ii) a seed-layer-deposition ion energy parameter, (iii) a seed-layer-deposition ion-incident-angle parameter, and (iv) a seed-layer-deposition temperature parameter.

In an exemplary embodiment, the values of the seed-layer-deposition pressure may range from about 1.00 E-05 Torr to about 4.00 E-04 Torr; the values of the seed-layer-deposition ion energy may range from about 300 eV to about 1.1 KeV; the values of the seed-layer-deposition ion-incident-angle may range from about 0 degrees to about 60 degrees off the substrate target; and the values of the seed-layer-deposition temperature may range from about 0 degrees C. to about 80 degrees C. The values of the process parameters may vary from those presented. In addition to the IBD process parameters presented, other IBD process parameters for forming the Ta or other material seed layer over the substrate thickness are possible.

At block 320, forming a first-ferromagnetic layer 118 over the seed layer 114 may be performed using various vapor deposition processes by depositing a layer of ferromagnetic material directly over the seed layer 114. Alternatively, the first-ferromagnetic layer 118 may be deposited over an intermediate layer, such as a fabrication-barrier layer, located between the seed layer and the first-ferromagnetic layer. As with other layers forming the GMR device, the first-ferromagnetic layer may be deposited by CVD and/or PVD, or other deposition technique.

In particular, the first-ferromagnetic layer 118 fabricated from NiFe alloy, CoFe alloy or any other ferromagnetic material may be deposited using an IBD process controlled by process parameters so that the first-ferromagnetic layer 118 achieves a thickness from about 2 angstroms to about 100 angstroms. The process parameters for depositing the first-ferromagnetic layer 118 may include (i) a ferromagnetic-layer-deposition pressure parameter, (ii) a ferromagnetic-layer-deposition ion energy parameter, (iii) a ferromagnetic-layer-deposition ion-incident-angle parameter, and (iv) a ferromagnetic-layer-deposition temperature parameter.

In producing an exemplary first-ferromagnetic layer 118, the ferromagnetic-layer-deposition pressure may range from about 1.00E-05 Torr to about 4.00E-04 Torr. Similarly, the ferromagnetic-layer-deposition ion energy parameter may range from about 300 eV to about 1.1 KeV. An exemplary range for the ferromagnetic-layer-deposition ion-incident-angle is from about 0 degrees to about 60 degrees. Exemplary temperatures for the ferromagnetic-layer-deposition temperature parameter may range from about 0 degrees C. to about 80 degrees C. The values of the IBD process parameters for forming the first-ferromagnetic layer may vary from those presented. Additionally, other IBD process parameters may be included in performing the function of forming the first-ferromagnetic layer.

At block 330, forming a spacer layer over 120 the first-ferromagnetic layer 118 may be carried out using various known vapor deposition processes. In an exemplary embodiment, the spacer layer 120 is formed directly over the first-ferromagnetic layer 118. In another exemplary embodiment, a facilitative layer may be formed directly over the first-ferromagnetic layer 118, separating the spacer layer 120 from the first-ferromagnetic layer 118. In any case, forming the spacer layer 120 may be performed by depositing a layer of conductive, non-magnetic material using CVD or PVD. The spacer layer 120, which may be fabricated from essentially pure Cu or some amalgamation of Cu, may be deposited using an IBD process so that the spacer layer 120 achieves a thickness from about 16 angstroms to about 60 angstroms.

As with other IBD depositions, in controlling the IBD process to achieve an exemplary spacer layer 120, each of the IBD process parameters may be set to a particular range. Included in the process parameters for depositing the spacer layer 120 by IBD are (i) a spacer-layer-deposition pressure parameter, (ii) a spacer-layer-deposition ion energy parameter, (iii) a spacer-layer-deposition ion-incident-angle parameter, and (iv) a spacer-layer-deposition temperature parameter.

The IBD process parameter values for producing the exemplary conductive, non-magnetic spacer layer 120 having a thickness from about 16 angstroms to about 60 angstroms using a Cu target may vary. In one of these variations, the spacer-layer-deposition pressure may range from about 1.00E-05 Torr to about 4.00E-04 Torr, and the spacer-layer-deposition ion energy parameter may range from about 300 eV to about 500 eV.

The range of exemplary angles for the spacer-layer-deposition ion-incident-angle may include angles from about 0 degrees to about 60 degrees. In the same way, an exemplary range of temperatures for the spacer-layer-deposition temperature parameter may be from about 0 degrees C. to about 80 degrees C. As with other IBD processes used in forming the GMR sensor element, alternative and additional IBD process parameters may be included in forming the spacer layer over the first-ferromagnetic layer.

At block 340, forming a second-ferromagnetic layer 124 over the spacer layer 120 may be performed in the substantially similar way as forming the first-ferromagnetic layer 118 over the seed layer 114. In so doing, a layer of ferromagnetic material may be deposited over the spacer layer 120 using one or more known vapor deposition processes. In exemplary embodiments, various NiFe alloys, CoFe alloys, amalgamations of these alloys, or any other ferromagnetic target material may be deposited using an IBD process in which a layer of ferromagnetic material having a thickness from about 10 angstroms to about 100 angstroms is formed directly over the spacer layer. Alternatively, a second-fabrication-barrier layer may be disposed between the second-ferromagnetic layer 124 and the spacer layer 120, thereby separating the spacer layer 120 from the second-ferromagnetic layer 124.

In forming the second-ferromagnetic layer 124, the exemplary IBD process parameters for depositing the first-ferromagnetic layer 118 may be used. Moreover, the values for the IBD process parameters used in depositing an exemplary first-ferromagnetic layer 118 may be used in depositing an exemplary second-ferromagnetic layer 124. For example, the ferromagnetic-layer-deposition pressure parameter for depositing a NiFe second-ferromagnetic layer 124 may range from about 1.00E-05 Torr to about 4.00E-05 Torr. The values for the ferromagnetic-layer-deposition ion energy parameter may range from about 300 eV to about 1.1 KeV.

Exemplary values for the ferromagnetic-layer-deposition ion-incident-angle may range from about 0 degrees to about 60 degrees. Like the rest of these parameters, the temperature range for the ferromagnetic-layer-deposition temperature parameter are generally known, and within these known values the temperatures may range from about 0 degrees C. to about 80 degrees C. The values of the IBD process parameters for forming the second-ferromagnetic layer 124 may vary from those presented, and alternative or additional process parameters may be included.

As shown in block 350, forming an antiferromagnetic layer over the second-ferromagnetic layer 124 may cause the GMR device to behave as a "spin-valve," where the magnetic moment (or moments) of the antiferromagnetic layer is free to spin in the presence of an applied magnetic field. Such a layer may be formed using known vapor deposition processes, such as CVD and PVD. Various FeMn alloys, IrMn alloys, PtMn alloys, amalgamations of these alloys, or any other antiferromagnetic target material may be deposited using an IBD process. Using an essentially pure FeMn target, the IBD process may produce an exemplary FeMn antiferromagnetic layer having a thickness ranging from about 70 angstroms to about 150 angstroms. While a third-buffer or fabrication-barrier layer may be formed between the second-ferromagnetic layer 124 and the antiferromagnetic layer, an exemplary GMR device may be formed when the antiferromagnetic layer is formed directly over the second-ferromagnetic layer 124.

In forming the antiferromagnetic layer over the second-ferromagnetic layer 124, in addition to the parameters discussed below, known IBD process parameters may also be used. Moreover, in addition to the values for the IBD process parameters used in depositing an exemplary antiferromagnetic layer described below, other values may also be used. Resembling the IBD process parameters for depositing the first-ferromagnetic and second-ferromagnetic layer 118, 124, the IBD process parameters for depositing the antiferromagnetic-layer may include (i) an antiferromagnetic-layer pressure parameter, (ii) an antiferromagnetic-layer-deposition ion energy parameter, (iii) an antiferromagnetic-layer-deposition-ion-incident-angle parameter, and (iv) an antiferromagnetic-layer-deposition temperature parameter.

Exemplary values for each of these process parameters may be as follows. The values for the antiferromagnetic-layer pressure parameter range from about 1.00E-05 Torr to about 4.00E-04 Torr. The antiferromagnetic-layer-deposition ion energy parameter may range from about 300 eV to about 1.1 KeV. The antiferromagnetic-layer-deposition-ion-incident-angle may range from about 0 degrees to about 60 degrees. The temperature for the antiferromagnetic-layer-deposition temperature parameter may range from about 0 degrees C. to about 80 degrees C.

As shown in block 360, forming a substantially antireflective cap layer 128 over the antiferromagnetic layer provides an insulating or highly resistive layer at top of the GMR stack. Such a layer may be formed using known vapor deposition processes, such as a low temp CVD or PVD process. The temperature for the TiN and/or AlN cap-deposition temperature parameter may range from about 25 degrees C. to about 200 degrees C.

Various TiN and/or AlN materials may be formed by using a reactive sputtering process with a pure Ti and/or Al target and Nitrogen gas. Low defect levels of these processes will contribute to limiting yield loss during manufacturing. The process may produce an exemplary TiN cap layer 128 having a thickness ranging from about 40 angstroms to about 500 angstroms. Alternatively, the process may produce an exemplary AlN cap layer 128 having a thickness ranging from about 10 angstroms to about 200 angstroms. While facilitative layers may be formed between the antiferromagnetic layer and the cap layer 128, an exemplary GMR device may be formed when the cap layer 128 is formed directly over the antiferromagnetic layer, if included, or directly over the second-ferromagnetic layer 124, if not. In forming the cap layer 128, in addition to the parameters discussed above, other known process techniques such as IBD may also be used.

While FIG. 2 illustrates exemplary functions for carrying out a method of manufacturing a GMR sensor element, other known steps and functions may be performed. These functions are for illustration purposes only and not necessarily intended to limit the scope of the present embodiments, provide sequential processing steps, or provide an inflexible fabrication recipe. As an example, an annealing function or process may be performed between carrying out each of the functions described above or after all the layers are formed. It is believed that this function of annealing the layers may enhance the antiferromagnetic and ferromagnetic coupling between the ferromagnetic layers of the GMR sensor element, because defects in the GMR sensor element's layers may be smoothed out or minimized.

5. Forming a Magnetic Bit

Figure 3:
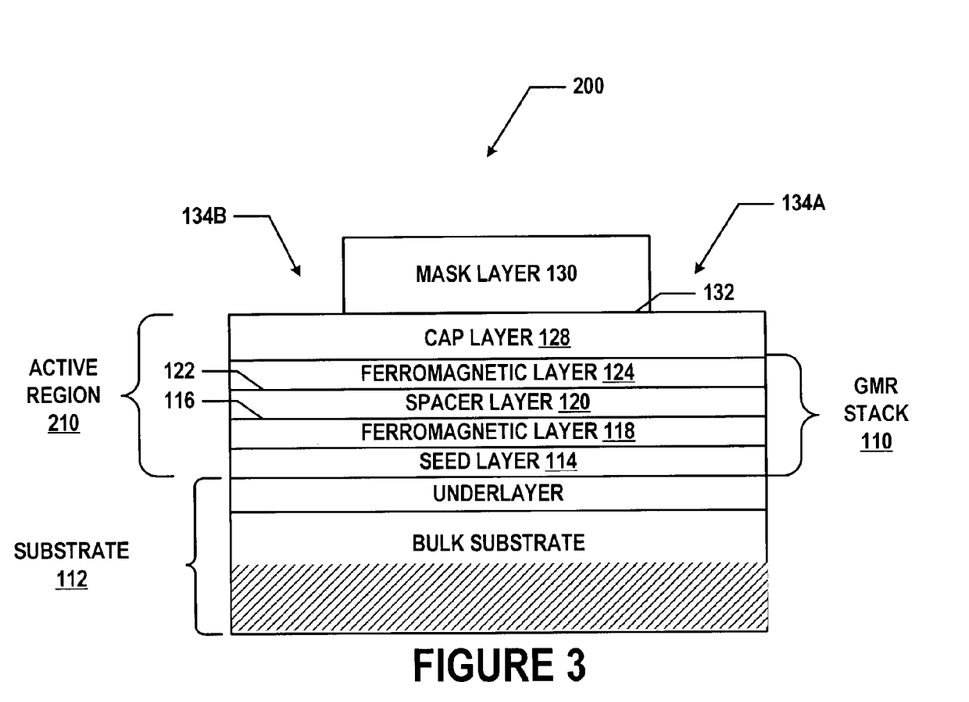
FIG. 3 is a second cross-sectional view of a GMR device illustrating a second stage of forming the GMR device into a magnetic bit in accordance with an exemplary embodiment.
Figure 4:
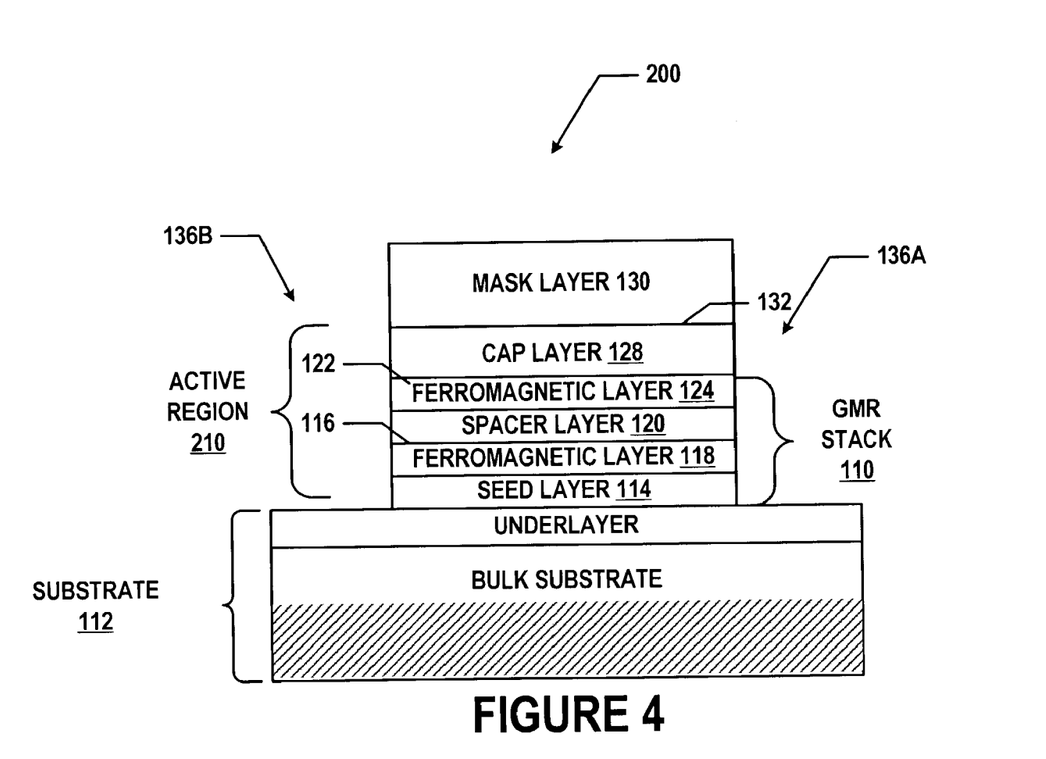
FIG. 4 is a third cross-sectional view of a GMR device illustrating a third stage of forming the GMR device into a magnetic bit in accordance with an exemplary embodiment.
Figure 5:
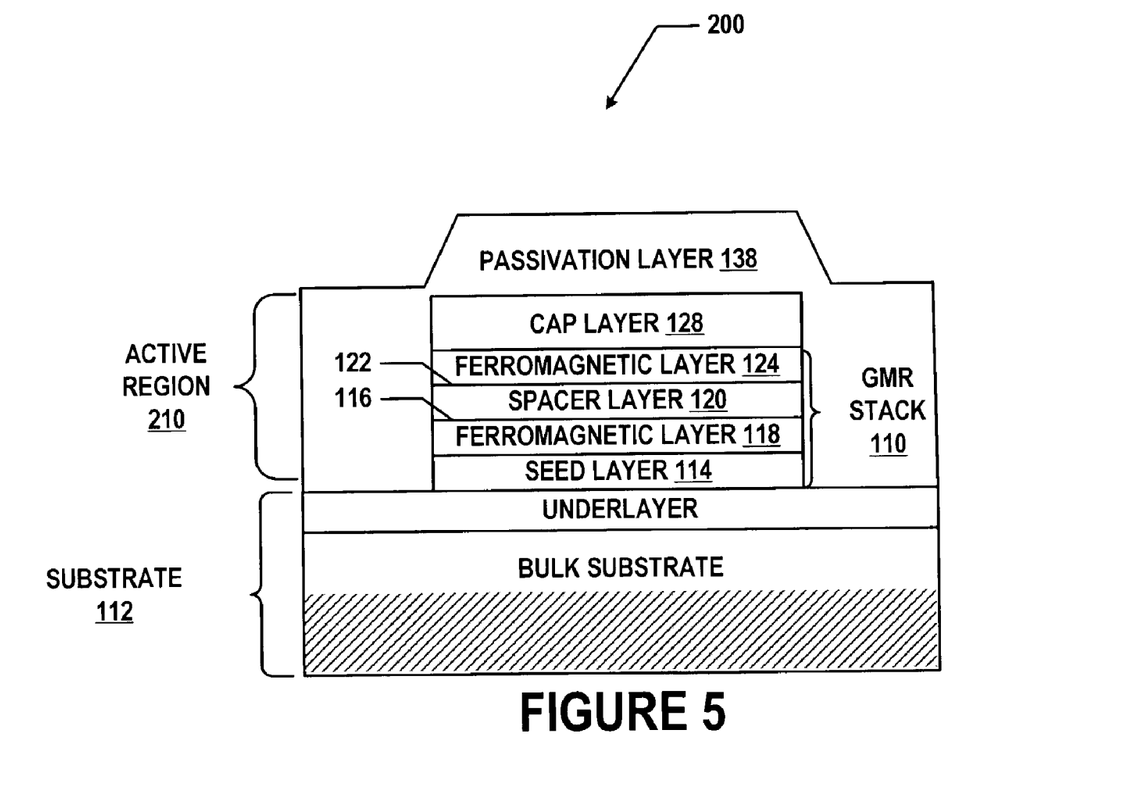
FIG. 5 is a fourth cross-sectional view of a GMR device illustrating a fourth stage of forming the GMR device into a magnetic bit in accordance with an exemplary embodiment.

After forming a GMR device using the GMR device manufacturing process shown in FIG. 2 (less the antiferromagnetic layer), a magnetic bit or sensor element may be formed from the resultant structure. FIGS. 3–5, and previously described FIG. 1 illustrate various stages of forming the GMR device into a magnetic bit in accordance with an exemplary embodiment. Other structures may be formed from the GMR device as well. FIGS. 3–5 are not necessarily to scale.

Referring now to FIG. 3, a second stage of processing is shown for forming an active region 210 of GMR magnetic bit 200. The GMR magnetic bit 200 shown in FIG. 3 is similar to the GMR device 100 shown in FIG. 1, except as described herein. The GMR magnetic bit 200 includes a mask layer 130 deposited atop the substantially antireflective cap layer 128.

Forming mask layer 130 over the cap layer 128 provides an insulating layer at the top of the GMR bit 200. The mask layer 130 may be formed into a mask for forming the active region 210 of the GMR bit 200. While facilitative layers may be formed between the cap layer 128 and the mask layer 130, an exemplary GMR magnet bit 200 may be formed when the mask layer 130 is formed directly over the cap layer 128 at mask interface 132. The mask layer 130 may be formed from $Si_3N_4$ using known vapor deposition processes, such as CVD and PVD.

An exemplary reactive sputtering PVD process may produce an exemplary mask layer 130 made of $Si_3N_4$ having a thickness ranging from about 400 angstroms to about 2000 angstroms. The temperature for the mask-deposition temperature parameter may range from about 25 degrees C. to about 200 degrees C.

After deposition and initial patterning (e.g., (i) resist application, and (ii) image/photolithograph/photomasking application) into a desired profile, the mask layer 130 is formed into a mask using an etching process, such as reactive ion etching (RIE). Other etching processes may be used as well. This process anisotropically removes portions 134a and 134b from the mask layer 130 stopping at about the mask interface 132. As noted below, the RIE process may produce a selective ratio of about 10:1 when removing the portions 134a and 134b. Because the mask layer 130 may be used as a mask for forming the active region of the GMR magnetic bit 200, an exemplary selectivity ratio for the mask material (i.e, the ratio of an etch rate of the mask layer 130 to an etch rate of the underlying cap layer 128) is centered about 10:1 having deviations from about 3:1 to about 50:1. These high selectivity ratios thus provide a high definition of the active region 210 of the GMR magnetic bit 200 and limit yield loss during manufacturing.

Due to high selectivity of etch rate of the substantially antireflective cap layer 128 formed from TiN and or AlN to the mask layer 130, and due to the inherent antireflective characteristics of the TiN and/or AlN material, other processing steps typically required for such high selectivity ratios with other cap materials might not be necessary. For instance, BARC processing steps are avoided using TiN and/or AlN as cap layer material. Because of the inherent antireflective characteristics of the TiN and/or AlN material, another benefit of using the TiN cap layer as an etch stop layer underlying the mask layer 130 is improved repeatability, accuracy, and image quality of later photolithographic (including photomasking) processing.

Referring now to FIG. 4, a third stage of processing is shown for forming an active region of GMR magnetic bit 200. The GMR magnetic bit 200 shown in FIG. 4 is similar to the GMR magnetic bit 200 shown in FIG. 3, except as described herein. Using the previously formed hard mask layer 130, the GMR bit 200 is formed using an ion beam etch process, via momentum transfer (also known as ion milling). This process removes portions 136a and 136b from the GMR magnetic bit 200.

Referring now to FIG. 5, a fourth stage of processing is shown for forming an active region 210 of GMR magnetic bit 200. The GMR magnetic bit 200 shown in FIG. 5 is similar to the GMR magnetic bit 200 shown in FIG. 4, except as described herein. The GMR magnetic bit 200 includes a passivation layer 138 deposited atop the mask layer 130 and the exposed substrate 112.

Forming passivation layer 138 over the mask layer 130 and the exposed substrate 112 provides an insulating layer at top of the GMR bit 200 for protecting the active region 210. The passivation layer 138 may comprise a $Si_3N_4$ layer. In addition to providing an electro-mechanical barrier against external environments, the $Si_3N_4$ layer may also provide scratch and moisture protection. The passivation layer 138 fabricated from un-doped $Si_3N_4$ may provide a sodium barrier, a strong dielectric, and an oxidation barrier protecting the underlying layers. The passivation layer 138 may be fabricated using other materials, as well.

While facilitative layers, such as metallization layers for interconnecting the elements of the GMR stack 110 and connecting the GMR stack 110 to the outside world, may be formed between the cap layer 128 and the mask layer 130, an exemplary GMR magnetic bit 200 may be formed when the passivation layer 138 is formed directly over the mask layer 130 and the exposed substrate 112. Such a layer still allows subsequent processing for interconnections and other processing. In an exemplary embodiment, the passivation layer 138 may be formed from $Si_3N_4$ using known vapor deposition processes, such as CVD and PVD.

An exemplary sputtering PVD process may produce an exemplary passivation layer 138 made of $Si_3N_4$ having a thickness ranging from about 500 angstroms to about 2500 angstroms using a reactive sputtering process with a pure Si target. The temperature for the passivation-deposition temperature parameter may range from about 25 degrees C. to about 200 degrees C.

While FIGS. 1 and 3–5 illustrate exemplary functions for forming an active region 210 of GMR magnetic bit 200, other known steps and functions may be performed. These functions are for illustration purposes only and not necessarily intended to limit the scope of the present embodiments, provide sequential processing steps, or provide an inflexible fabrication recipe. For example, the processing steps for cleaning, photolithography and masking functions may be performed between carrying out each, some or all of the functions described above, and/or after all the layers are formed.

6. Conclusion

In view of the wide variety of embodiments to which the principles of the present invention can be applied, it should be understood that the illustrated embodiments are exemplary only, and should not be taken as limiting the scope of the present invention. For example, the steps of the flow diagrams may be taken in sequences other than those described, and more or fewer elements may be used in the block diagrams. Further, the orientation of the layers may be located differently from that presented. The claims should not be read as limited to the described order or elements unless stated to that effect. In addition, use of the term "means" in any claim is intended to invoke 35 U.S.C. §112, paragraph 6, and any claim without the word "means" is not so intended. Therefore, all embodiments that come within the scope and spirit of the following claims and equivalents thereto are claimed as the invention.

Preferred and alternative embodiments of the present invention have been illustrated and described. The composition of the GMR device described above provides common elements that may be used in various GMR sensors, such as unpinned sandwich GMR sensors and/or magnetic memories, such as Magnetic Random Access Memory (MRAM). By further including a first-antiferromagnetic layer in the composition, the GMR device may be deployed as (i) top and bottom spin-valve magnetoresistive sensor elements, (ii) synthetic antiferromagnetically biased giant magnetoresistive sensor elements, (iii) spin filter giant magnetoresistive sensor elements, (iv) filter synthetic antiferromagnetically biased giant-magnetoresistive sensor elements, and/or (v) other antiferromagnetically exchanged-biased (or "pinned-layer") GMR sensor elements.

These and other magnetoelectronic devices may be beneficially deployed as read/write heads for direct access storage devices, such as disk drives; as sensors in transduction applications, such as navigational sensors, traffic control switches, proximity sensors; and in a multitude of other uses. It will be understood, however, that changes and modifications may be made to the invention without deviating from its true spirit and scope, as defined by the following claims.

What is claimed is:

1. A method for fabricating a magnetoresistive device comprising, in combination:
   forming a current-in-plane magnetoresistive stack;
   forming a substantially-antireflective-cap layer over the current-in-plane magnetoresistive stack, wherein the substantially-antireflective-cap layer has a sufficiently high resistivity so to limit current shunting of the current-in-plane magnetoresistive stack through the substantially-antireflective-cap layer, wherein the substantially-antireflective-cap layer is usable as an etch stop for the current-in-plane magnetoresistive stack, and wherein the substantially-anti-reflective-cap layer is in contact with the magnetoresistive stack;
   forming a dielectric layer over the substantially-antireflective-cap layer;
   patterning the dielectric layer in the form of at least one active region, wherein the active region is oriented normal to the substantially-antireflective-cap layer; and
   forming an insulating layer over a substrate and under the current-in-plane magnetoresistive stack.

2. A method for fabricating a magnetoresistive device comprising, in combination:
   forming a current-in-plane magnetoresistive stack;
   forming a substantially-antireflective-cap layer over the current-in-plane magnetoresistive stack, wherein the substantially-antireflective-cap layer has a sufficiently high resistivity so to limit current shunting of the current-in-plane magnetoresistive stack through the substantially-antireflective-cap layer, wherein the substantially-antireflective-cap layer is usable as an etch stop for the current-in-plane magnetoresistive stack, and wherein the substantially-anti-reflective-cap layer is in contact with the magnetoresistive stack;
   forming a dielectric layer over the substantially-antireflective-cap layer;
   patterning the dielectric layer in the form of at least one active region, wherein the active region is oriented normal to the substantially-antireflective-cap layer; and
   photomasking the dielectric layer using an active-region photomask, wherein the photolithography of the dielectric layer is substantially unaffected by the substantially-antireflective-cap layer.

3. A method for fabricating a magnetoresistive device comprising, in combination:
   forming a current-in-plane magnetoresistive stack;
   forming a substantially-antireflective-cap layer over the current-in-plane magnetoresistive stack, wherein the substantially-antireflective-cap layer has a sufficiently high resistivity so to limit current shunting of the current-in-plane magnetoresistive stack through the substantially-antireflective-cap layer, wherein the substantially-antireflective-cap layer is usable as an etch stop for the current-in-plane magnetoresistive stack, and wherein the substantially-anti-reflective-cap layer is in contact with the magnetoresistive stack;
   forming a dielectric layer over the substantially-antireflective-cap layer;
   patterning the dielectric layer in the form of at least one active region, wherein the active region is oriented normal to the substantially-antireflective-cap layer; and
   etching the dielectric layer to form an active-region mask.

4. The method of claim 3, wherein the etching of the dielectric layer effectively ceases at the interface between the substantially-antireflective-cap layer and the dielectric layer.

5. The method of claim 4, further comprising etching a portion of the substantially-antireflective-cap layer in the form of the active-region mask.

6. The method of claim 5, further comprising etching a portion of the current-in-plane magnetoresistive stack to form the at least one active region.

7. The method of claim 6, further comprising forming a second-dielectric layer over the at least one active region.

8. A method for fabricating a magnetoresistive device comprising, in combination:
    forming a current-in-plane magnetoresistive stack;
    forming a substantially-antireflective-cap layer over the current-in-plane magnetoresistive stack, wherein the substantially-antireflective-cap layer has a sufficiently high resistivity so to limit current shunting of the current-in-plane magnetoresistive stack through the substantially-antireflective-cap layer, wherein the substantially-antireflective-cap layer is usable as an etch stop for the current-in-plane magnetoresistive stack, wherein the substantially-anti-reflective-cap layer is in contact with the magnetoresistive stack, and wherein the substantially-antireflective-cap layer is formed at a substrate temperature of less than about 200 degrees C.;
    forming a dielectric layer over the substantially-antireflective-cap layer; and
    patterning the dielectric layer in the form of at least one active region, wherein the active region is oriented normal to the substantially-antireflective-cap layer.

* * * * *